United States Patent
Lamprecht et al.

(10) Patent No.: US 8,871,631 B2
(45) Date of Patent: Oct. 28, 2014

(54) METHOD TO FORM SOLDER DEPOSITS ON SUBSTRATES

(75) Inventors: Sven Lamprecht, Berlin (DE); Kai-Jens Matejat, Berlin (DE); Ingo Ewert, Berlin (DE); Stephen Kenny, Berlin (DE)

(73) Assignee: Atotech Deutschland GmbH, Berlin (DE)

(*) Notice: Subject to any disclaimer, the term of this patent is extended or adjusted under 35 U.S.C. 154(b) by 153 days.

(21) Appl. No.: 13/701,501

(22) PCT Filed: Jun. 23, 2011

(86) PCT No.: PCT/EP2011/060580
§ 371 (c)(1),
(2), (4) Date: Dec. 1, 2012

(87) PCT Pub. No.: WO2012/004137
PCT Pub. Date: Jan. 12, 2012

(65) Prior Publication Data
US 2013/0168438 A1    Jul. 4, 2013

(30) Foreign Application Priority Data
Jul. 5, 2010    (EP) .................................... 10168468

(51) Int. Cl.
*H01L 21/44*    (2006.01)
*H01L 23/498*    (2006.01)
*H01L 21/48*    (2006.01)
*B23K 1/20*    (2006.01)

(52) U.S. Cl.
CPC ............ *B23K 1/20* (2013.01); *H01L 23/49816* (2013.01); *H01L 21/4853* (2013.01)
USPC .......................................................... 438/612

(58) Field of Classification Search
None
See application file for complete search history.

(56) References Cited

U.S. PATENT DOCUMENTS

| 8,507,376 | B2 * | 8/2013 | Ewert et al. ................... 438/614 |
|---|---|---|---|
| 2001/0007373 | A1 | 7/2001 | Kadota et al. |
| 2006/0079081 | A1 | 4/2006 | Hsu et al. |
| 2006/0219567 | A1 | 10/2006 | Hu |
| 2007/0218676 | A1 | 9/2007 | Wang et al. |
| 2010/0046235 | A1 | 2/2010 | Burgunder et al. |
| 2011/0189848 | A1 * | 8/2011 | Ewert et al. ................... 438/612 |

OTHER PUBLICATIONS

PCT/EP2011/060580; PCT International Search Report and Written Opinion of the International Searching Authority dated Dec. 22, 2011.

* cited by examiner

*Primary Examiner* — Seahvosh Nikmanesh
(74) *Attorney, Agent, or Firm* — Renner, Otto, Boisselle & Sklar, LLP

(57) ABSTRACT

Described is a method of forming a solder deposit on a substrate comprising the following steps i) provide a substrate that includes at least one inner contact area, ii) contact the entire substrate area including the at least one inner contact area with a solution suitable to provide a conductive layer on the substrate surface, iii) form a patterned resist layer, iv) electroplate a solder deposit layer containing a tin or tin alloy onto the inner contact area, v) remove the patterned resist layer, vi) form a solder resist layer having solder resist openings on the substrate surface.

13 Claims, 8 Drawing Sheets

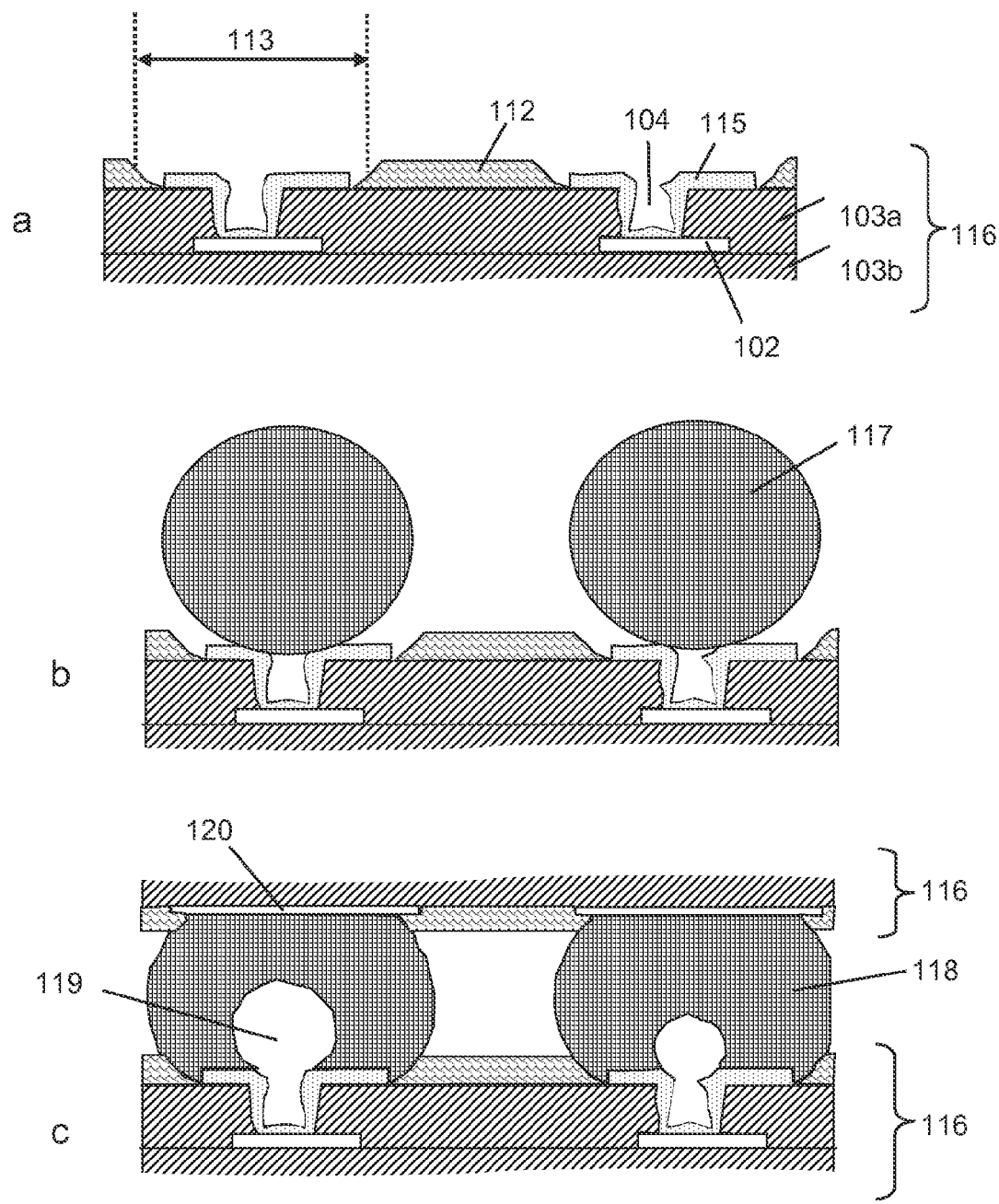
Fig. 1: Prior Art Process

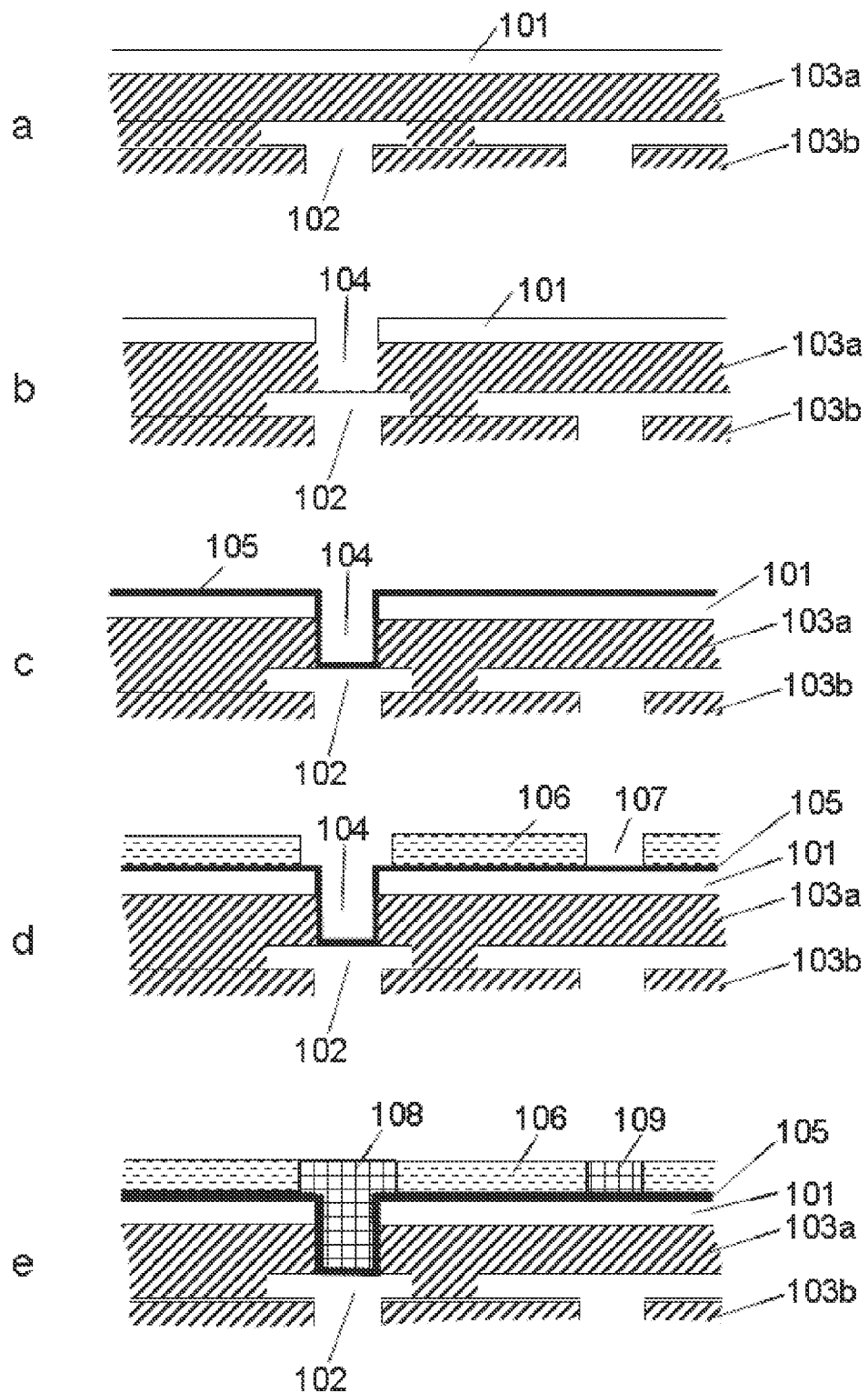

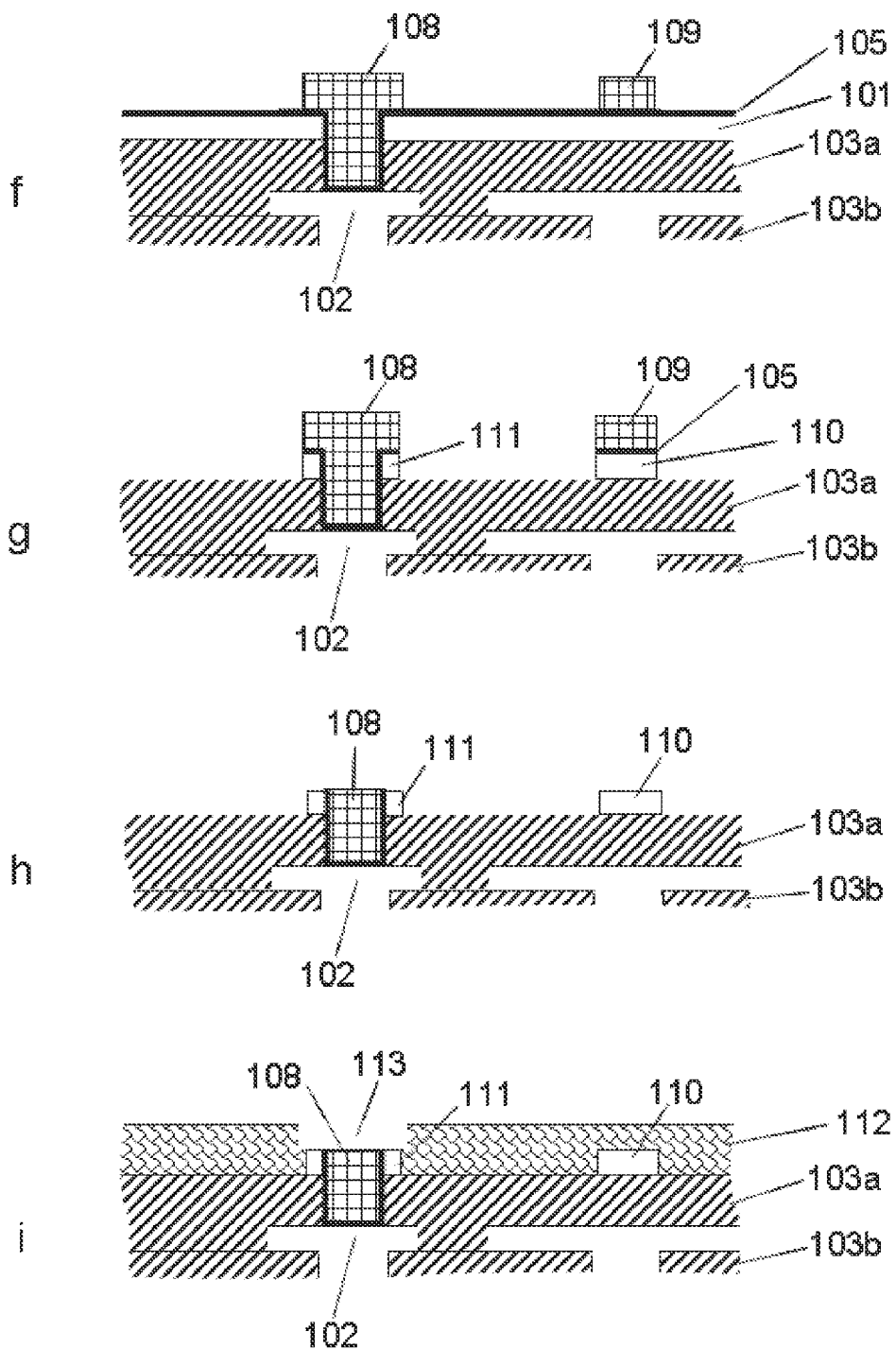

METHOD TO FORM SOLDER DEPOSITS ON SUBSTRATES

FIELD OF THE INVENTION

The invention relates to the formation of solder deposits by electroplating, particularly to flip chip packages, more particularly to flip chip joints and board to board solder joints formed by electroplated solder of tin and tin alloys.

BACKGROUND OF THE INVENTION

Since the introduction of the flip chip technology by IBM in the early 1960s, the flip chip devices have been mounted on an expensive ceramic substrate where the thermal expansion mismatch between the silicon chip and the ceramic substrate is less critical. In comparison with wire bonding technology, the flip chip technology is better able to offer higher packaging density (lower device profile) and higher electrical performance (shorter possible leads and lower inductance). On this basis, the flip chip technology has been industrially practiced for the past 40 years using high-temperature solder (controlled-collapse chip connection, C4) on ceramic substrates. However, in recent years, driven by the demand of high-density, high-speed and low-cost semiconductor devices for the trend of miniaturization of modern electronic products, the flip chip devices mounted on a low-cost organic circuit board (e.g. printed circuit board or substrate) with an epoxy underfill to mitigate the thermal stress induced by the thermal expansion mismatch between the silicon chip and organic board structure have experienced an explosive growth. This notable advent of low-temperature flip chip joints and organic-based circuit board has enabled the current industry to obtain inexpensive solutions for fabrication of flip chip devices.

In the current low-cost flip chip technology, the top surface of the semiconductor integrated circuit (IC) chip has an array of electrical contact pads. The organic circuit board has also a corresponding grid of contacts. The low-temperature solder bumps or other conductive adhesive material are placed and properly aligned in between the chip and the circuit board. The chip is flipped upside down and mounted on the circuit board, in which the solder bumps or conductive adhesive materials provide electrical input/output (I/O) and mechanical interconnects between the chip and circuit board. For solder bump joints, an organic underfill encapsulant may be further dispensed into the gap between the chip and circuit board to constrain the thermal mismatch and lower the stress on the solder joints.

In general, for achieving a flip chip assembly by solder joints, the metal bumps, such as solder bumps, gold bumps or copper bumps, are commonly pre-formed on the pad electrode surface of the chip, in which the bumps can be any shape, such as stud bumps, ball bumps, columnar bumps, or others. The corresponding solder bumps (or say presolder bumps), typically using a low-temperature solder, are also formed on the contact areas of the circuit board. At a reflow temperature, the chip is bonded to the circuit board by means of the solder joints. After dispensing of an underfill encapsulant, the flip chip device is thus constructed. Such methods are well known in the art and typical examples of the flip chip devices using solder joints are for example described in U.S. Pat. No. 7,098,126 (H. -K. Hsieh et al.).

Currently, the most common method for formation of presolder bumps on the circuit board is the stencil printing method. Some prior proposals in relation to the stencil printing method can be referred to U.S. Pat. No. 5,203,075 (C. G. Angulas et al.), U.S. Pat. No. 5,492,266 (K. G. Hoebener et al.) and U.S. Pat. No. 5,828,128 (Y. Higashiguchi et al.). Solder bumping technique for flip chip assemblies requires design considerations regarding both bump pitch and size miniaturization. According to practical experiences, the stencil printing will become infeasible once the bump pitch is decreased below 0.15 millimeter. In contrast, the solder bumps deposited by electroplating offer the ability to further reduce bump pitch down to below 0.15 millimeter. The prior proposals in relation to electroplate bumps on the circuit board for flip chip bonding can be found in U.S. Pat. No. 5,391,514 (T. P. Gall et al.) and U.S. Pat. No. 5,480,835 (K. G. Hoebener et al.). Although electroplate solder bumping on the circuit board offers finer bump pitch over stencil printing, it presents several challenges for initial implementation.

A multi-step process to form solder on an organic substrate is described in U.S. Pat. No. 7,098,126 (H. -K. Hsieh et al.). In the method, there is initially provided an organic circuit board including a surface bearing electrical circuitry that includes at least one contact area. A solder mask layer that is placed on the board surface and patterned to expose the pad. Subsequently, a metal seed layer is deposited by physical vapor deposition, chemical vapor deposition, electroless plating with the use of catalytic copper, or electroplating with the use of catalytic copper, over the board surface. A resist layer with at least an opening located at the pad is formed over the metal seed layer. A solder material is then formed in the opening by electroplating. Finally, the resist and the metal seed layer beneath the resist are removed. To apply this method various patterning steps are required which is not desired from the overall standpoint of process efficiency. Furthermore the method has its limitations if the distance between adjacent contact areas (pitch) is very small as a result of the miniaturization of electronic devices.

A method for forming metal bumps is disclosed in US 2007/0218676 A1. The method disclosed therein comprises application and planarization of a first photo resist prior to deposition of a conductive layer and requires a patterned photo resist to remove excess solder material and parts of the conductive layer.

A conventional process to form void free BGA (Ball Grid Array) solder joints, e.g., between a printed circuit board and an IC substrate is shown in FIG. 1. A substrate 103a, 103b having blind micro vias (BMV's) 104 exposing inner contact pads 102 is coated with a solder resist layer 112. The solder resist layer 112 is structured to form solder resist openings (SRO's) 113. Next, the BMV's 104 are conformally coated with a metal layer 115, e.g., a copper layer. Solder balls 117 are attached to the SROs (FIG. 1b), a second substrate 116 having outer layer contact pads 120 is mounted onto the substrate having solder balls 117 attached and subjected to a reflow process. During reflow the solder balls 117 then become solder joints 118. Voids 119 are formed inside the solder joints 118 and BMV's 104 which reduce the mechanical stability and electrical conductivity of solder joints 118 and are therefore not desired.

Instead of solder balls 117 known processes also use screen printed solder paste. However, formation of voids 119 occurs also in this case.

The formation of voids 119 is especially an unsolved problem for BMV's having a diameter of less than 200 µm.

SUMMARY OF THE DISCLOSURE

Accordingly, it is the aim of the present invention to provide a method for forming solder deposits on substrates like circuit boards, which avoids the formation of voids during or after reflow operations and at the same time involves a reduced number of process steps. Furthermore, it is the aim to offer a plating method yielding solder material of high uniformity which is suitable to form solder deposits on very fine structures.

Furthermore, it is the aim to avoid the formation of voids in the solder material during reflow processes which reduce the mechanical stability and electrical conductivity of the later to form solder joints.

It is therefore an objective of the present invention to adopt an electroplating method of tin and tin alloys to produce a uniform layer of a solder deposit on a substrate. Such baths should be suitable to fill recess structures such as BMV's possessing high aspect ratios without leaving undesired voids or dimples.

Another object of the present invention is to provide a method for solder deposition having a reduced number of plating steps and which is universally applicable even when the solder resist openings have different dimensions. At the same time patterning of an outer copper layer is feasible.

In summary, a method of fabricating electroplate solder deposits on a substrate for forming flip chip joints and board to board solder joints is disclosed. According to the present invention, there is provided a non-conductive substrate like a circuit board including a surface bearing electrical circuitry which includes at least one contact area. Such contact area can be any conductive surface area, e.g. a contact pad, the topmost area of a circuitry facing outside the substrate or an inner contact pad which is exposed to the substrate surface by a BMV.

A conductive seed layer is formed on the entire surface area. Optionally, prior to the deposition of the seed layer a diffusion barrier can be deposited onto the contact pads. Next, a resist layer is deposited onto the substrate surface and patterned to form openings for the contact pads and BMV's.

A solder deposit layer consisting of tin or a tin alloy is deposited by electroplating into areas not protected by the patterned resist layer.

Thereafter, the patterned resist layer is removed and the conductive seed layer is removed from those surface areas not covered by the solder deposit layer. Next, a solder resist layer is deposited onto the substrate surface having layers of solder material and SRO's exposing the solder material formed.

BRIEF DESCRIPTION OF THE FIGURES

FIG. 1 shows a prior art method to obtain a ball grid array (BGA) solder joint between two substrates.

Figure 2:
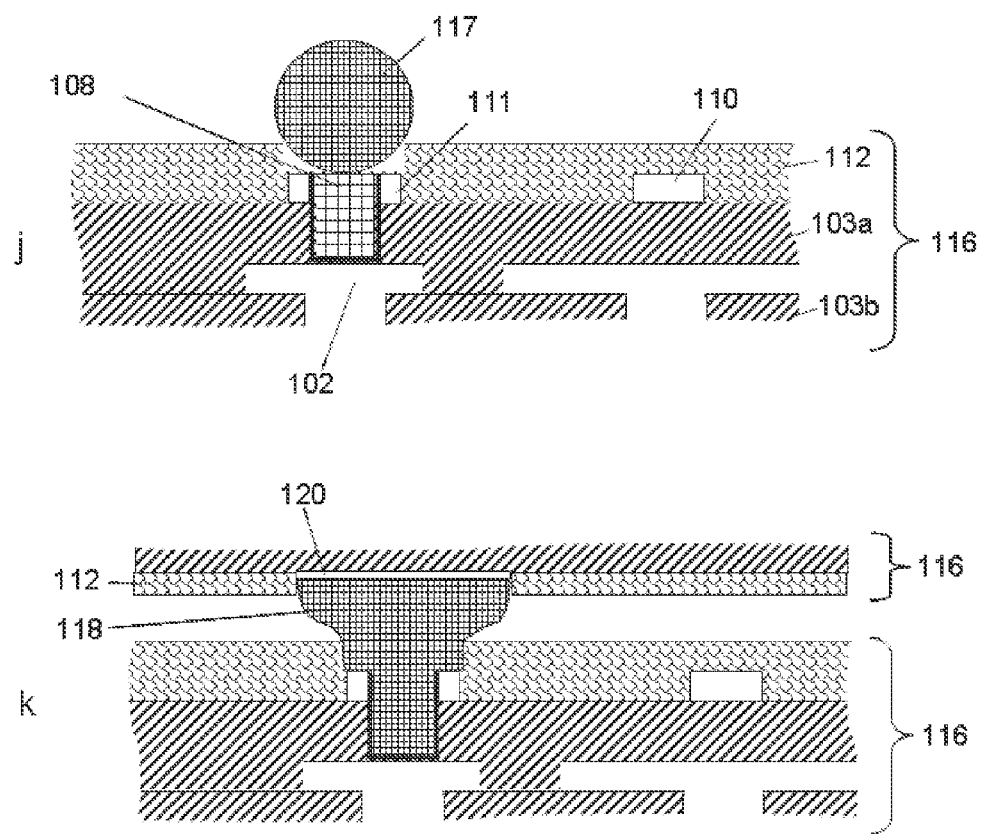
FIG. 2 shows a method according to the present invention to obtain a void free BGA solder joint between two substrates.

101 Outer layer copper layer
102 Inner layer contact pad
103*a* Outer non-conductive substrate layer
103*b* Inner non-conductive substrate layer
104 Opening for inner layer contact pad (BMV)
105 Conductive seed layer
106 Plating resist layer
107 Opening for metal resist
108 Solder deposit layer
109 Patterned metal resist layer
110 Patterned outer layer copper layer
111 Copper ring
112 Solder resist layer
113 Solder resist opening
114 Tin etch resist layer
115 Additional metal layer
116 Printed circuit board or IC substrate
117 Solder ball
118 Solder joint after reflow
119 Void in solder joint
120 Outer layer contact pad
121 Intermediate solder deposit top layer
122 Intermediate patterned metal resist top layer

DETAILED DESCRIPTION OF THE INVENTION

The invention provides a method of forming a solder deposit on a substrate by electroplating a tin or tin alloy layer. The process is particularly suitable for fabricating solder bumps on a circuit board. The method is described below in more detail. The figures shown herein are simply illustrative of the process. The figures are not drawn to scale, i.e. they do not reflect the actual dimensions or features of the various layers in the chip package structure or printed circuit board. Like numbers refer to like elements throughout the description.

Now referring to FIG. 2, in accordance with a preferred embodiment of the present invention, there is provided a non-conductive substrate 103*a*/103*b*, which has inner contact pads 102 as a contact area embodiment and a copper layer 101 on its surface (FIG. 2*a*). The non-conductive substrate 103*a*/103*b* can be a circuit board which may be made of an organic material or a fiber-reinforced organic material or a particle-reinforced organic material, etc., for example, epoxy resin, polyimide, bismeleimide triazine, cyanate ester, polybenzocyclobutene, or glass fiber composite thereof, etc. A blind micro via (BMV) 104 is formed by mechanical or laser drilling in order to expose the inner contact pad 102 (FIG. 2*b*). Said inner contact pad 102 is formed typically from a metal, such as copper.

Optionally, a barrier layer (not shown in FIG. 2) is formed on the inner contact pads 102 and can e.g. be an adhesive layer of nickel or a protective layer of gold. Said barrier layer may also be made of palladium, silver, tin, a nickel/gold stack, a nickel/palladium stack, a chromium/titanium stack, a palladium/gold stack, or a nickel/palladium/gold stack, etc., which can be made by electroplating, electroless plating, chemical vapour deposition (CVD), or physical vapor deposition (PVD), etc.

Next, a conductive seed layer 105 is deposited onto the substrate surface including the outer layer of copper 101, the inner contact pads 102 and the walls of the BMV 104 (FIG. 2*c*). In general, the seed layer is for example formed by electroless deposition in the conventional manufacturing industry of non-conductive surfaces and well known in the art.

The conductive seed layer 105 is electrically conductive, provides adhesion, permits the exposed portions of its upper surface to be electroplated, and can prevent migration of the subsequent solder deposit metal to the underlying metal of the contact area. Alternatively, the seed layer may be composed of two metal layers. A preferred example for the second metal is copper, since it provides a suitable surface for subsequent electroplating.

The non-conductive substrates can be activated before electroplating by application of a conductive seed layer. Various methods which are described, for example, in Printed Circuits Handbook, C. F. Coombs Jr. (Ed.), 6$^{th}$ Edition, McGraw Hill, pages 28.5 to 28.9 and 30.1 to 30.11 can be used for said activation. These processes involve the formation of a conductive layer comprising carbon particles, Pd colloids or conductive polymers.

Some of these processes are described in the patent literature and examples are given below:

European patent EP 0 616 053 describes a process for applying a metal coating to a non-conductive substrate (without an electroless coating) comprising:
a. contacting said substrate with an activator comprising a noble metal/Group IVA metal sol to obtain a treated substrate;
b. contacting said treated substrate with a self accelerating and replenishing immersion metal composition having a pH above 11 to pH 13 comprising a solution of;
   (i) a Cu(II), Ag, Au or Ni soluble metal salt or mixtures thereof,
   (ii) a Group IA metal hydroxide,
   (iii) a complexing agent comprising an organic material having a cumulative formation constant log K of from 0.73 to 21.95 for an ion of the metal of said metal salt.

This process results in a thin conductive layer which can be used for subsequent electrocoating. This process is known in the art as the "Connect" process.

U.S. Pat. No. 5,503,877 describes the metallisation of non-conductive substrates involving the use of complex compounds for the generation of metal seeds on a non-metallic substrate. These metal seeds provide for sufficient conductivity for subsequent electroplating. This process is known in the art as the so-called "Neoganth" process.

U.S. Pat. No. 5,693,209 relates to a process for metallisation of a non-conductive substrate involving the use of conductive pyrrole polymers. The process is known in the art as the "Compact CP" process.

European patent 1 390 568 B1 also relates to direct electrolytic metallisation of non-conductive substrates. It involves the use of conductive polymers to obtain a conductive layer for subsequent electrocoating. The conductive polymers have thiophene units. The process is known in the art as the "Seleo CP" process.

Finally, the non-conductive substrate can also be activated with a colloidal or an ionogenic palladium ion containing solution, methods for which are described, for example, in Printed Circuits Handbook, C. F. Coombs Jr. (Ed.), 6$^{th}$ Edition, McGraw Hill, pages 28.9 and 30.2 to 30.3.

According to the present invention, said conductive seed layer 105 may be made of a single metal layer, a single metal alloy layer or made of multilayer of at least two distinct single layers. Metals and metal alloys suitable as conductive seed layer are selected from the group consisting of copper, tin, cobalt, nickel, silver, tin-lead alloy, copper-nickel alloy, copper-chromium alloy, copper-ruthenium alloy, copper-rhodium alloy, copper-silver alloy, copper-iridium alloy, copper-palladium alloy, copper-platinum alloy, copper-gold alloy and copper-rare earth alloy, copper-nickel-silver alloy, copper-nickel-rare earth metal alloys. Copper and copper alloys are preferred as a conductive seed layer 105.

In accordance with a preferred embodiment of the present invention, said conductive seed layer 105 can also be formed by an electroless plating method, wherein the catalytic metal does not use noble metal but uses copper as the catalytic metal. The typical examples for forming such a catalytic copper on a non-conductive surface can be found in the U.S. Pat. Nos. 3,993,491 and 3,993,848.

The thickness of said conductive seed layer 105 preferably is less than 0.1 millimeter and more preferably between 0.0001 millimeter and 0.005 millimeter. Depending on the solubility of said seed layer 105 in the solder material, said seed layer 105 can either completely dissolve into the solder deposit or still at least partially exist after the reflow process.

In a preferred embodiment of the present invention said seed layer 105 is made of copper. During reflow operations said seed layer 105 is completely dissolved into the solder deposit layer 108 and forms a homogeneous tin-copper alloy. The target thickness of the seed layer 105 can be adjusted depending on the volume of the to be deposited solder material 108 in order to obtain a tin-copper alloy after reflow which resembles that of typical lead-free solder materials, e.g., a tin-copper alloy with 3 wt.-% copper.

In another embodiment of the present invention a copper-nickel alloy is deposited by electroless plating as the conductive seed layer 105. During a reflow operation the conductive seed layer 105 is dissolved into the solder deposit layer 108 and forming a homogeneous tin-copper-nickel alloy. Again, adjusting the thickness of said seed layer 105 and adjusting the nickel content in said seed layer 105 in respect to the expected volume of the later on deposited solder deposit layer 108 leads to a targeted tin-copper-nickel alloy composition after reflow operations which resembles a composition of typical Sn—Cu—Ni solder materials.

A thinner seed layer 105 is preferred, since the thinner seed layer can be removed sooner in the etching solution, the time required for said non-conductive substrate 103a/103b immersed in an etching solution could be shortened.

Referring now to FIG. 2d, a resist layer 106 is deposited onto the substrate and patterned by techniques known in the art. After patterning the BMV's are exposed.

Next, a solder deposit layer 108 is formed in the BMV's 104 by electroplating (FIG. 2e).

In one embodiment of the present invention this process step also enables to form resist patterns on the outer copper layer 101 coated with the conductive seed layer 105 by formation of openings 107 (FIG. 2d). This embodiment allows to create an outer circuit 110 (FIG. 2h) while manufacturing solder deposit layers in BMV's 104. In this case the solder material serves also as a patterned metal resist layer 109 necessary for formation of the outer circuitry 110.

In accordance with a preferred embodiment of the present invention, said solder material 108 is a tin or tin alloy made by the mixture of tin and the elements selected from the group consisting of lead, silver, copper, bismuth, antimony, zinc, nickel, aluminum, magnesium, indium, tellurium, and gallium.

Tin and tin alloy plating baths are known in the art. Commonly used tin or tin alloy plating bath compositions and process parameters for plating are described in the following.

Among other components of the bath may be added a source of $Sn^{2+}$ ions, an anti-oxidant, and a surfactant.

The source of $Sn^{2+}$ ions may be a soluble tin-containing anode, or, where an insoluble anode is used, a soluble $Sn^{2+}$ ion source. Tin methane sulfonic acid, $Sn(MSA)_2$, is a preferred source of $Sn^{2+}$ ions because of its high solubility. Typically, the concentration of the source of $Sn^{2+}$ ions is sufficient to provide between about 10 g/l and about 100 g/l of $Sn^{2+}$ ions into the bath, preferably between about 15 g/l and about 95 g/l, more preferably between about 40 g/L and about 60 g/l. For example, $Sn(MSA)_2$ may be added to provide between about 30 g/l and about 60 g/l $Sn^{2+}$ ions to the plating bath.

A preferred alloy is tin silver alloy. In such case the plating bath additionally contains a soluble silver salt, commonly used are nitrate, acetate, and preferably methane sulfonate. Typically, the concentration of the source of $Ag^+$ ions is sufficient to provide between about 0.1 g/l and about 1.5 g/l of $Ag^+$ ions into the bath, preferably between about 0.3 g/l and about 0.7 g/l, more preferably between about 0.4 g/l and about 0.6 g/l. For example, Ag(MSA) may be added to provide between about 0.2 g/l and about 1.0 g/l $Ag^+$ ions to the plating bath.

Anti-oxidants may be added to the baths of the present invention to stabilize the bath against oxidation of $Sn^{2+}$ ions in solution. Preferred anti-oxidants such as hydroquinone, catechol, hydroxyl- and amino-substituted pyridine and any of the hydroxyl, dihydroxyl, or trihydroxyl benzoic acids may be added in a concentration between about 0.1 g/l and about 10 g/l, preferably between about 0.5 g/l and about 3 g/l. For example, hydroquinone may be added to the bath at a concentration of about 2 g/l.

Surfactants may be added to promote wetting of the substrate. The surfactant seems to serve as a mild deposition inhibitor which can suppress three-dimensional growth to an extent, thereby improving morphology and topography of the film. It can also help to refine the grain size, which yields a more uniform bump. Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, aryl alkylether sulfonates, aryl sulfonates, and sulfosuccinates.

The electrolytic plating bath of the present invention preferably has an acidic pH to inhibit anodic passivation, achieve better cathodic efficiency, and achieve a more ductile deposit. Accordingly, the bath pH is preferably between about 0 and about 3. In the preferred embodiment the pH of the bath is 0. Accordingly, the preferred acidic pH can be achieved using nitric acid, acetic acid, and methane sulfonic acid. In one preferred embodiment, the acid is methane sulfonic acid. The concentration of the acid is preferably between about 50 g/L and about 200 g/l, more preferably between about 70 g/l and about 120 g/l. For example, between about 50 g/l and about 160 g/l methane sulfonic acid can be added to the electroplating bath to achieve a bath of pH 0 and act as the conductive electrolyte.

Typical bath compositions are for example disclosed in: Jordan: The Electrodeposition of Tin and its Alloys, 1995, p. 71-84.

The plating of tin and tin alloys for solder depot plating can be performed by direct current (DC) or pulse plating. Pulse plating techniques are particularly suitable to fill structures of the present invention as shown in FIGS. 2-6. The advantages of pulse plating are better surface distribution uniformity and improved crystal structures with tin deposits possessing finer grain sizes and therefore better solderability properties. Also, higher applicable current density and therefore higher throughput can be obtained by pulse plating compared to DC plating.

Generally, current pulses at an effective current density of 1-20 $A/dm^2$ can be applied. Alternatively, operating of the bath with DC at a current density of 1-3 $A/dm^2$ can be performed.

For example, applying a tin pulse plating with a current density of 3 $A/dm^2$ yields an average thickness of the tin deposit of 40 μm within 30 min. plating time. The thickness variation on the surface is only +/−15%. Applying DC plating a maximum current density of only 1 $A/dm^2$ can be obtained. Plating time to obtain a thickness of the tin deposit of 40 μm is 86 min. The variation on the surface is +/−33%, thus much higher than for pulse plating.

Preferred pulse parameters are as follows:

The ratio of the duration of the at least one forward current pulse the duration of the at least one reverse current pulse is adjusted to at least 1: 0-1:7, preferably to at least 1:0.5-1:4 and more preferably to at least 1: 1-1:2.5.

The duration of the at least one forward current pulse can be adjusted to preferably at least 5 ms to 1000 ms.

The duration of the at least one reverse current pulse is preferably adjusted to 0.2-5 ms at most and most preferably to 0.5-1.5 ms.

The peak current density of the at least one forward current pulse at the workpiece is preferably adjusted to a value of 1-30 $A/dm^2$. Particularly preferable is a peak current density of the at least one forward current pulse at the workpiece of about 2-8 $A/dm^2$ in horizontal processes. In vertical processes the most preferred peak current density of the at least one forward current pulse at the workpiece is 1-5 $A/dm^2$.

The peak current density of the at least one reverse current pulse at the work piece will preferably be adjusted to a value of 0-60 $A/dm^2$. Particularly preferred is a peak current density of the at least one reverse current pulse at the workpiece of about 0-20 $A/dm^2$ in horizontal processes. In vertical processes the most preferred peak current density of the at least one forward current pulse at the workpiece is 0-12 $A/dm^2$.

Now, again referring to FIG. 2: in the next step, the resist layer 106 is removed by techniques known in the art (FIG. 2e) leaving the solder deposit layer 108, the outer copper layer 101, the conductive seed layer 105 and optionally the patterned metal resist layer 109.

Referring to FIG. 2g, the conductive seed layer 105 and the outer copper layer 101 which are not protected by the solder deposit layer 108 and optionally also the patterned metal resist layer 109 are removed.

The removal preferably is performed by chemical etching completely the conductive seed layer 105 and the outer copper layer 101 not covered by the solder deposit layer 108 and optionally the patterned metal resist layer 109. The solder deposit layer 108 has the function of the etch resist when removing the conductive seed layer 105 and the outer copper layer 101 not covered by the solder deposit layer 108. Hence, no additional etch resist or mask such as a photo resist is required. The etching of copper and copper alloys, also known as stripping, can be performed electrolytically or chemically.

Generally the conductive seed layer 105 and the outer copper layer 101 can be removed in a single etching step with the same etching solution while the solder deposit layer 108 serves as the etch resist. Suitable etching solutions can be chosen applying routine experiments.

Typical etching or stripping compositions for copper and copper alloys are for example disclosed in: Printed Circuits Handbook, C. F. Coombs Jr. (Ed.), $6^{th}$ Edition, McGraw Hill, pages 34.6 to 34.18.

Typical etching compositions for copper and copper alloys are mixtures of persulfates and sulphuric acid, caro acid, mixtures of peroxides and mineral acids, mixtures of $CuCl_2$, peroxides and mineral acids, mixtures of $CuCl_2$ and ammonia.

Next, the optional patterned metal resist layer 109 is removed by etching or stripping (FIGS. 2g and 2h).

Typical etching or stripping compositions for tin and tin alloys are for example disclosed in: Jordan: The Electrodeposition of Tin and its Alloys, 1995, p. 373-377.

During electrolytic stripping methods tin or its alloys are anodically dissolved in a wt. % NaOH solution at 70-90° C.

Chemical stripping generally is performed in solutions containing a strong base like NaOH (about 10 wt.-%) at elevated temperatures of 70-90° C. Organic additives, particularly nitroaromtic compounds like p-nitrophenol, may be added to the solution.

Alternatively, chemical stripping can be performed in the following solutions:

hydrogen peroxide, often with added fluoride,
systems based on nitric acid and nitrates, 5-40 wt.-% of nitrate,
systems based on HCl/copper chloride, containing 5-20 wt.-% HCl with an initial concentration of 2.5 mg/l copper chloride.

Optionally the patterned metal resist layer 109 is removed and at the same time a portion of the solder deposit layer 108 (FIG. 2h). In this case the solder deposit layer 108 is mechanically stabilized by an annular ring of copper 111 formed by the non-etched portion of the outer copper layer 101.

Referring now to FIG. 2i, a solder resist layer 112 is deposited onto the substrate surface and then patterned to form openings 113 to expose the solder deposit layer 108, protect the patterned outer copper layer 110 and provide insulation.

Both mechanical and laser drilling can be applied for this purpose. Laser drilling is the preferred method for the formation of an opening 113 having a diameter of ≤150 µm. Either UV type or $CO_2$ type laser drilling methods can be applied.

The openings 113 in the structures according to the FIG. 2i are denoted SRO (solder resist openings) and preferably have a dimension of about 5-1.000 µm, preferably of about 10-500 µm and even more preferred 20-250 µm. The height of the SROs varies between 5-250 µm, preferably of about 10-50 µm. The distance of the center points of adjacent contacts areas is denoted as pitch and ranges from 90-300 µm for IC substrates, and from 150-1.000 µm for printed circuits The solder resist layer 112 is deposited by known techniques. Examples applicable to the present invention are screen printing and/or photo lithographic processes. Various types of solder masks can be used in accordance with the present invention: UV-hardening solder masks, thermal curable two-component solder masks and photo imageable solder masks.

Next, a solder ball 117 or a solder paste is attached to the SRO 113 and solder deposit layer 108 (FIG. 2j) and soldered to a second substrate having outer layer contact pads 120 by a reflow operation (FIG. 2k). The resulting solder joints 118 are free of voids.

Figure 3:
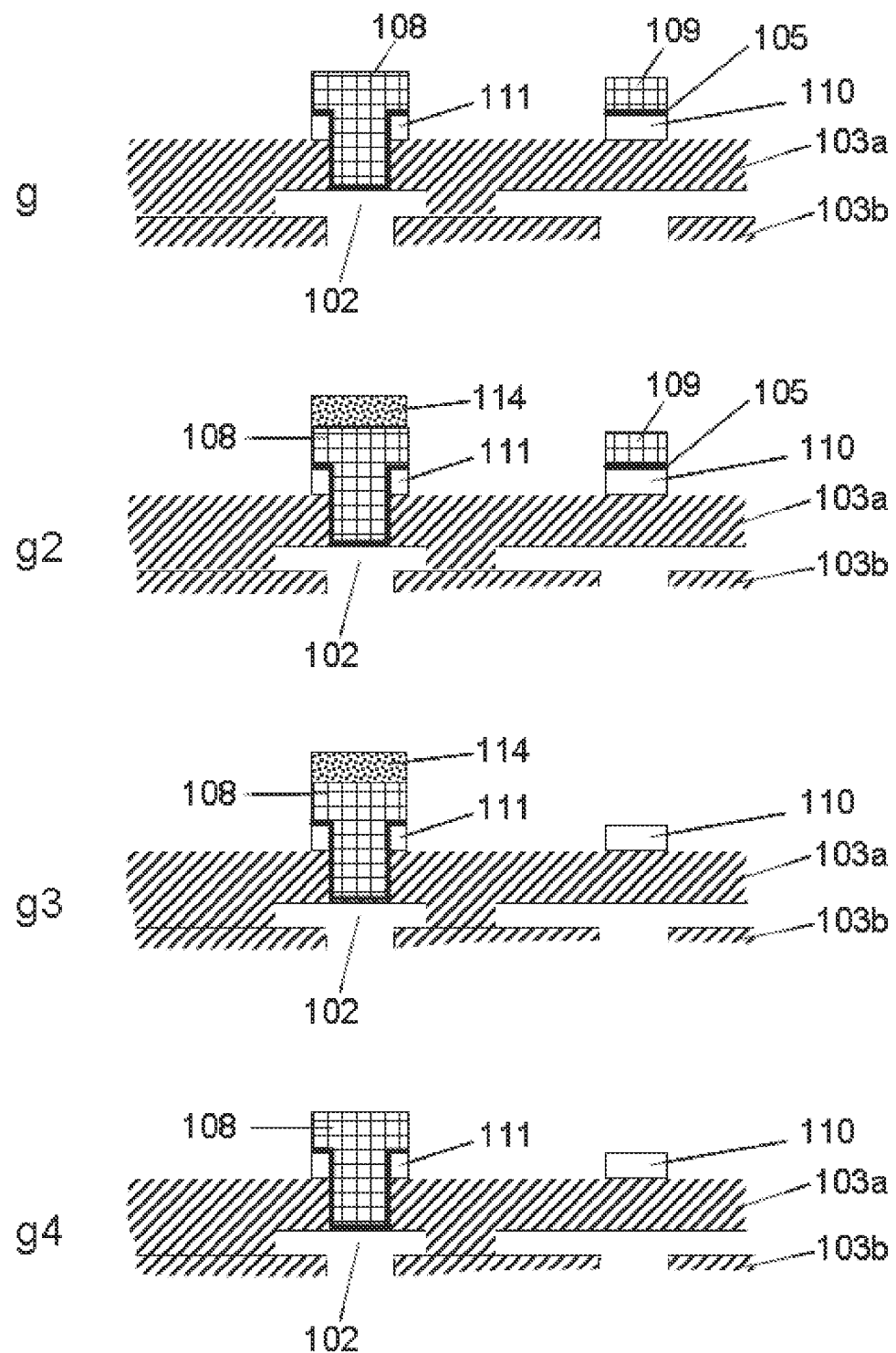
FIG. 3 shows a method according to the present invention to obtain a void free BGA solder joint with an increased solder deposit volume.

While this process sequence has been described in detail for a substrate according to FIG. 2 it is not limited to such and may be applied to all kind of substrates. Some additional preferred embodiments of the present invention which can be treated accordingly are shown in FIGS. 3-6. In still another embodiment of the present invention a high solder deposit layer 108 and an outer circuitry 110 are formed (FIG. 3): a tin etch resist layer 114 is deposited onto the substrate surface and patterned that only the solder deposit layer 108 is protected by the resist layer (FIG. 3g2). Then the patterned metal resist layer 109 is removed while maintaining the resist layer 114 protected solder deposit layer 108 (FIG. 3g3). Next the resist layer 114 is removed.

In still another embodiment of the present invention, a resist layer 114 is deposited onto the patterned metal resist layer 109 instead of onto the solder deposit layer 108 as shown in FIG. 3g2. Then, additional solder material is deposited by electroplating onto the solder deposit layer 108 followed by removal of the resist layer 114 and the removal of the patterned resist layer 109.

Figure 4:
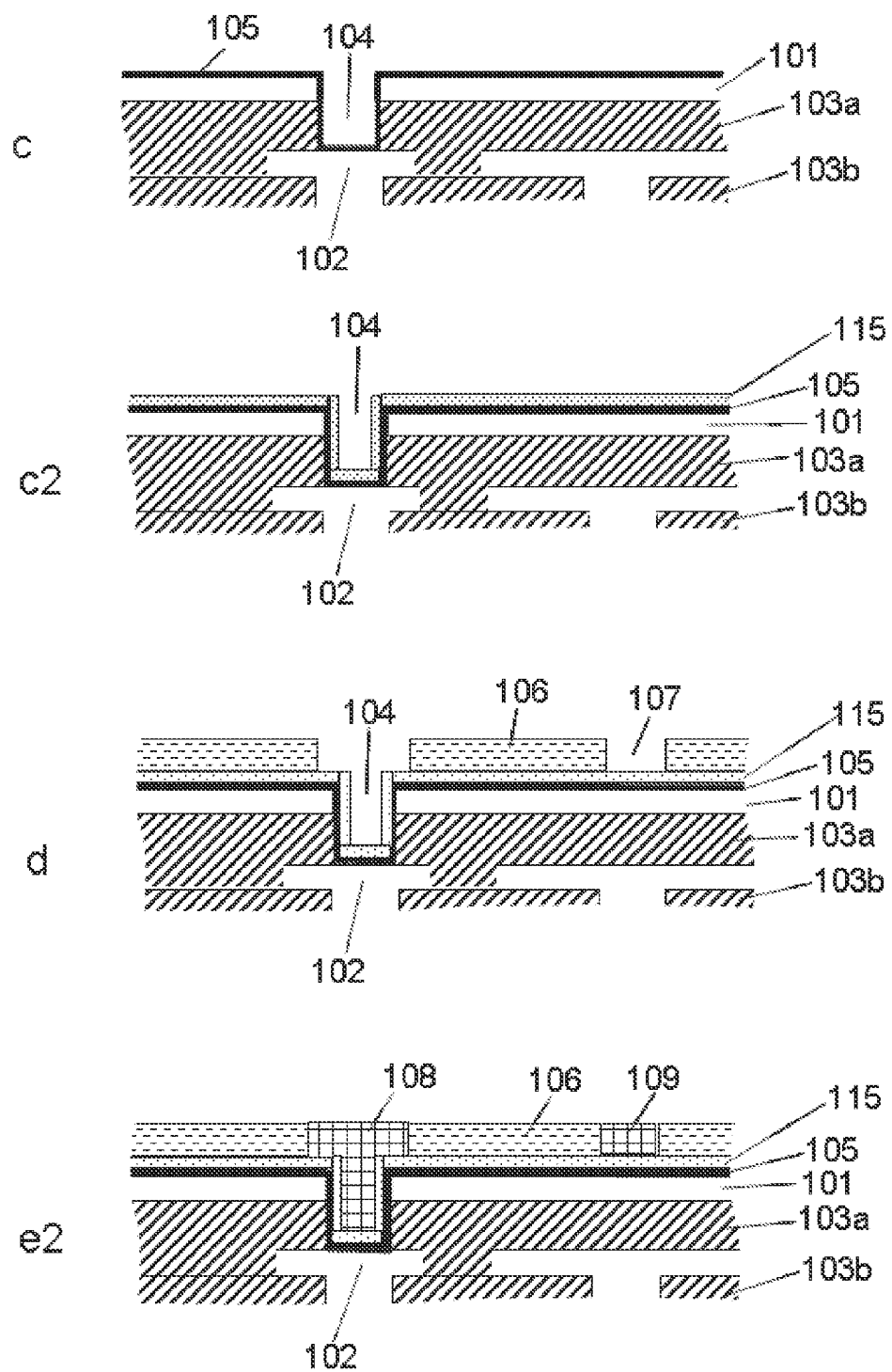
FIG. 4 shows a method according to the present invention to obtain a void free BGA solder joint with an increased electrical conductivity.

Now referring to FIG. 4, a conformal coating of a metal 115 is applied onto the conductive seed layer 105 (FIG. 4c2). The preferred metal 115 is copper or a copper alloy deposited by electroplating. Next, a resist layer 106 is attached to the substrate surface, patterned by techniques known in the art in order to expose conformally coated BMV's 104 and optionally openings for a metal resist 107 (FIG. 4d). Then a solder deposit layer 108 is plated into the conformally coated BMV's 104 and optionally as a patterned metal resist layer 109 into optional openings 107 (FIG. 4e).

Figure 5:
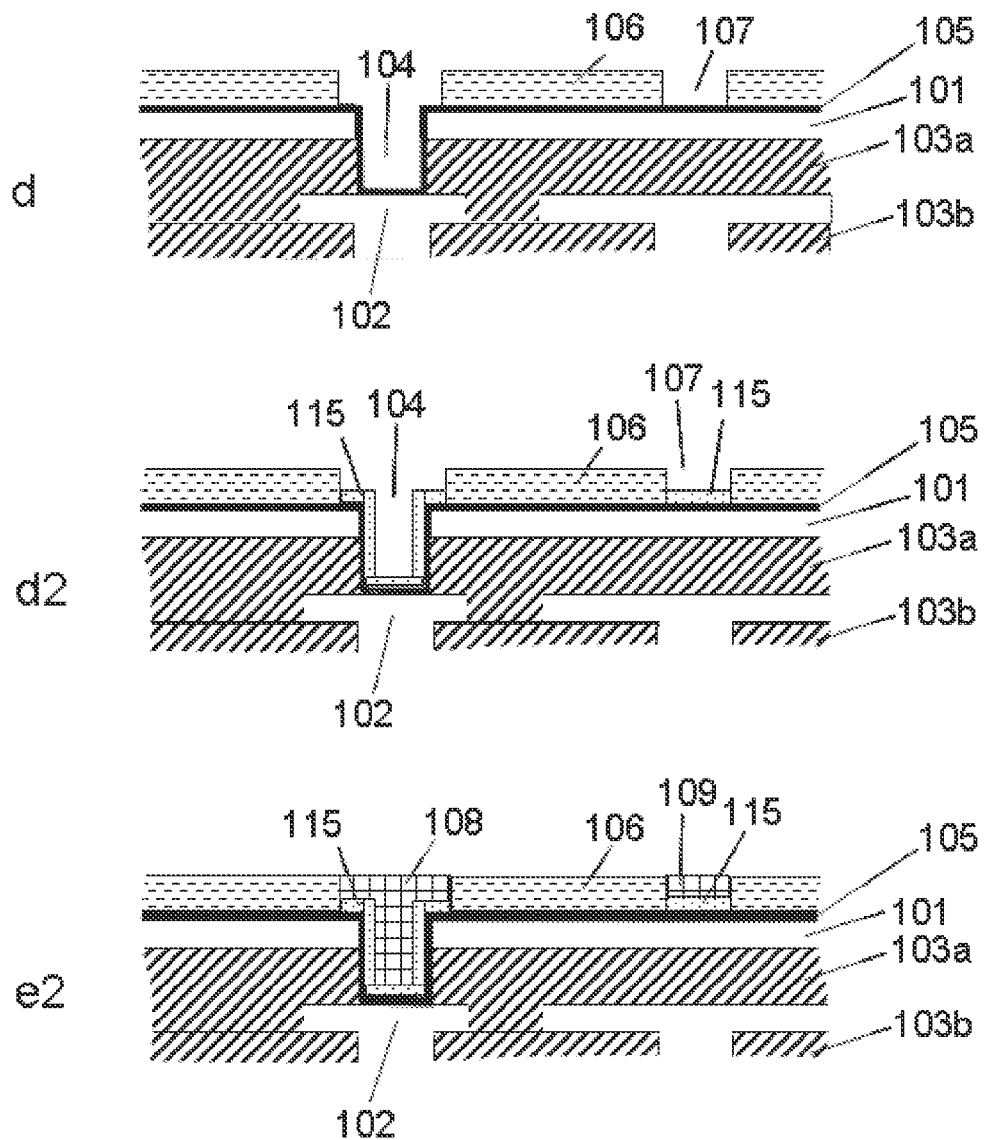
FIG. 5 shows a method according to the present invention to obtain a void free BGA solder joint with an increased electrical conductivity.

In still another embodiment of the present invention (FIG. 5) a resist layer 106 is attached to the substrate surface and patterned in order to expose the BMV's 104 and optionally the openings for a metal resist layer 107 (FIG. 5d). Next, the BMV's 104 are conformally coated with an additional metal layer 115 which is most preferred an electroplated layer of copper or a copper alloy (FIG. 5d2). Optionally, an additional metal layer 115 is deposited into the optional openings for a metal resist layer 107. The solder deposit layer 108 is then deposited by electroplating into the conformally coated BMV's 104 (FIG. 5e).

Figure 6:
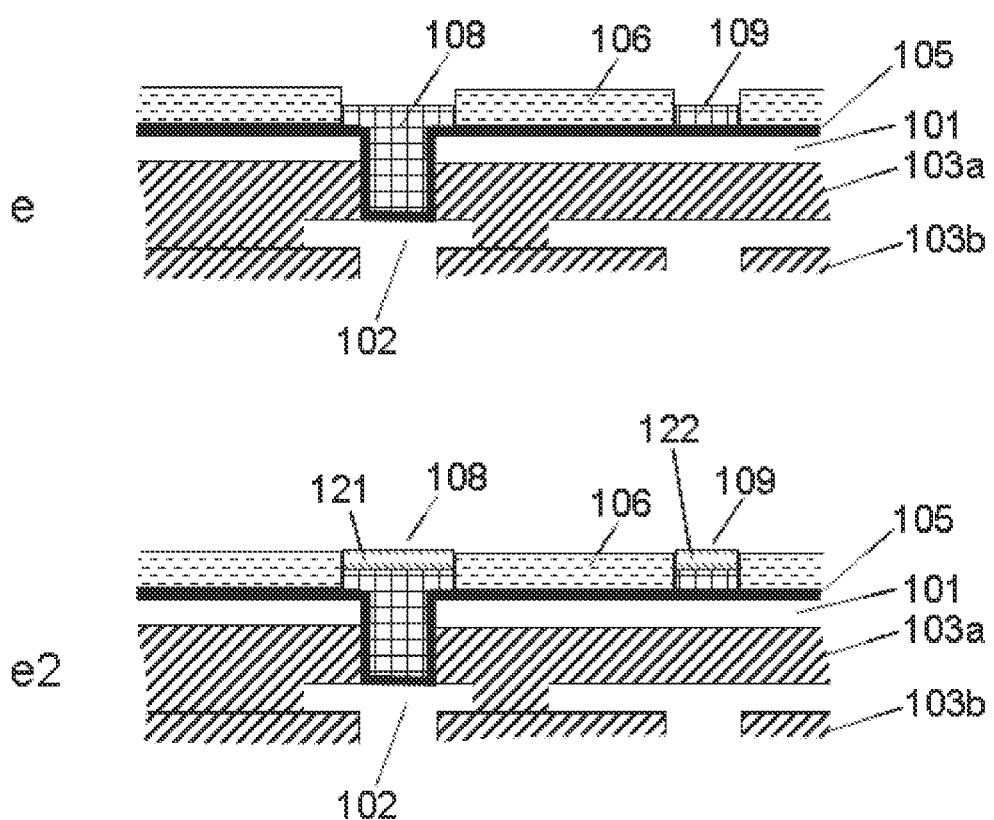
FIG. 6 shows a method according to the present invention to obtain a void free BGA solder joint with a solder deposit deposited in two steps.

In still another embodiment of the present invention (FIG. 6) an intermediate solder deposit top layer 121 is deposited onto the solder deposit layer 108 and optionally an intermediate patterned metal resist top layer 122 onto the patterned metal resist layer 109 (FIG. 6e2). The intermediate solder deposit top layer 121 and the intermediate metal resist top layer preferably consist of a metal selected from the group consisting of silver, copper, nickel and alloys of the aforementioned metals with tin. The intermediate solder deposit top layer 121 functions as a reservoir for alloy formation with the solder deposit layer 108 during reflow operations. For example, an intermediate solder deposit layer 121 consisting of silver and a solder deposit layer 108 consisting of tin form a homogeneous tin-silver alloy during reflow operations. The thickness and composition of the intermediate solder deposit top layer 121 in respect to the volume and composition of the solder deposit layer 108 can be utilized to obtain a solder material alloy with desired composition and properties.

The following example further illustrates the present invention.

EXAMPLE

The process sequence is according to FIG. 2.

A PCB substrate having an outer copper layer 101 and inner layer contact pads 102 according to FIG. 2a is used.

In the next step openings 104 are drilled with a UV-laser (FIG. 2b).

Smear inside the openings 104 is removed by a desmear process, i.e., an alkaline permanganate treatment comprising a) swelling of the plastic material in a butylglycol-based swelling agent, b) permanganate etching with a potassium permanganate based composition and c) reducing with a reductor solution comprising hydrogen peroxide.

Next, a conductive seed layer 105 of copper is formed on the entire substrate surface (FIG. 2c). For this the surface is first contacted with an acidic solution containing ionogenic palladium and then with a solution for electroless copper deposition.

Then, a dry film photo resist 106 (PM 250, DuPont) is laminated onto the outer copper layer 101. The dry film photo resist is patterned in a standard procedure to expose the openings 104 (FIG. 2*d*).

Thereafter, a tin solder deposit layer 108 and a patterned metal resist layer 109 are plated on the conductive layer (FIG. 2*e*) from a bath containing:

45 g/l $Sn^{2+}$ as $Sn(MSA)_2$, 60 ml/l MSA (70% solution), 2 g/l Hydroquinone and 100 mg/l benzal acetone.

The pH of the bath is 0, the temperature 25° C. Plating is for 7 min. Pulse plating is used applying the following parameters:

Average current density of the forward current pulse: 2 $A/dm^2$;
Duration of the forward current pulse: 20 ms;
Average current density of the reverse current pulse: 0 $A/dm^2$ (no reverse pulse, only pause pulse);
Duration of the reverse current pulse: 4 ms.

The openings 108 according to FIG. 2*e* are completely filled with tin solder deposit without any void formation. Furthermore, the openings 107 are filled with a patterned metal resist layer 109.

Then, the patterned dry film photo resist 106 is removed with an aqueous solution of 2 wt.-% potassium carbonate (FIG. 2*f*).

The structured copper layer 110 and the copper ring 111 are formed by etching the copper layer 101 and the conductive seed layer 105 with a etching composition comprising 200 ml/l HCl (32%) and 160 $g/CuCl_2.2H_2O$ (FIG. 2*g*). For this purpose the substrate is contacted with the etching composition in a horizontal set-up having an array of nozzles at a temperature of 45° C. The contact time is about 30 s. The solder deposit layer 108 has the function of a metal resist. Hence, no additional etch resist or mask such as a photo resist is used for forming the structured copper layer 110 and the copper ring 111.

The patterned metal resist layer 109 and part of the solder deposit layer 108 are removed in the next step by treatment in a solution containing 30 vol.-% nitric acid at a temperature of 40° C. for 1 min (FIG. 2*h*).

Next, a solder resist layer 112 having a thickness of 25 μm (Lackwerke Peters, ELPEMER SD 2467 SG-DG (525)) is deposited onto the structured copper layer 110 and the adjacent surface of the non-conductive substrate 103*a*. The solder resist layer is photo structured in order to expose the solder deposit layer 108 (FIG. 2*i*).

The tin solder deposits 108 are void free, show a very homogenous surface distribution and are whisker free. The substrate is suited to be soldered to a chip or a circuit.

The resulting solder joints after reflow 118 soldering are free of voids.

The invention claimed is:

1. A method of forming a solder deposit on a substrate comprising the following steps:
    a. provide a substrate including a copper or copper alloy surface that includes at least one inner layer contact pad,
    b. form an opening for the at least one inner layer contact pad extending through the copper surface,
    c. contact the entire substrate surface including the opening and the at least one inner layer contact pad with a solution suitable to provide a conductive layer on the substrate surface,
    d. deposit and pattern a resist layer whereby the at least one inner layer contact pad is exposed,
    e. electroplate a solder deposit layer consisting of tin or tin alloy into the openings,
    f. remove the resist layer,
    g. remove the bare conductive layer which is not covered by a solder deposit layer and the copper or copper alloy surface beneath said conductive layer which is not covered by a tin or tin alloy layer by etching wherein the solder deposit layer 108 has the function of the etch resist,
    h. apply a solder resist layer and form solder resist openings to expose the solder deposit layer.

2. The method according to claim 1 wherein in step d also openings for a metal resist are formed which are filled with a patterned metal resist layer by electroplating of tin or tin alloy in step e.

3. The method according to claim 2 wherein the additional process steps
    g2 deposit a tin etch resist layer onto the solder deposit layer and remove layer and
    g3 remove of the tin etch resist layer from the solder deposit layer are applied.

4. The method according to claim 1 wherein a metal resist layer is removed by etching.

5. The method according to claim 1 wherein an additional metal layer is deposited between step c. and step d. in claim 1.

6. The method according to claim 1 wherein an additional metal layer is deposited between step d. and step e. in claim 1.

7. The method according to claim 1 wherein an intermediate solder deposit top layer is deposited onto the solder deposit layer.

8. The method according to claim 1 wherein the conductive seed layer is selected from the group consisting of copper, nickel, silver, alloys thereof and multilayers of the aforementioned metals and alloys.

9. The method according to claim 1 wherein a reflow treatment is applied to the substrate having a solder deposit layer and a solder resist layer attached.

10. The method according to claim 1 wherein the inner layer contact pad 102 comprises a via or trench.

11. The method according to claim 1 wherein the substrate is a printed circuit board, an IC substrate or an interposer.

12. The method according to claim 2 wherein a metal resist layer is removed by etching.

13. The method according to claim 3 wherein a metal resist layer is removed by etching.

* * * * *